United States Patent [19]
Mulholland et al.

[11] Patent Number: 6,005,814
[45] Date of Patent: Dec. 21, 1999

[54] TEST MODE ENTRANCE THROUGH CLOCKED ADDRESSES

[75] Inventors: Sean B. Mulholland; James D. Allan, both of Colorado Springs, Colo.

[73] Assignee: Cypress Semiconductor Corporation, San Jose, Calif.

[21] Appl. No.: 09/054,654

[22] Filed: Apr. 3, 1998

[51] Int. Cl.$^6$ ........................................................ G11C 7/00
[52] U.S. Cl. ............................................. 365/201; 365/233
[58] Field of Search ..................................... 365/200, 201, 365/233; 371/21.1, 21.2, 21.3

[56] References Cited

U.S. PATENT DOCUMENTS 5,781,485   7/1998   Lee et al. ................................. 365/201

Primary Examiner—Vu A. Le
Attorney, Agent, or Firm—Blakely, Sokoloff, Taylor & Zafman LLP

[57] ABSTRACT

A robust system for entering a test mode in an integrated circuit, for example, a memory device, greatly eliminates the probability of unintentionally entering the test mode, yet provides a system of access through a precise address and control pin sequence. By using an existing control pin present on the integrated circuit as a clock signal input for a series of latches, the present scheme sets up a number of address with predetermined values in order to create a key that is correct only if all the addresses are at the correct values. The key, combined with the clock signal input, allows a test mode enable signal to pass through each latch in a series. By further requiring that the address sequence for the key be input during an otherwise "illegal" operation for the integrated circuit, the present scheme further ensures that unintentional entry to the test mode is avoided.

21 Claims, 11 Drawing Sheets

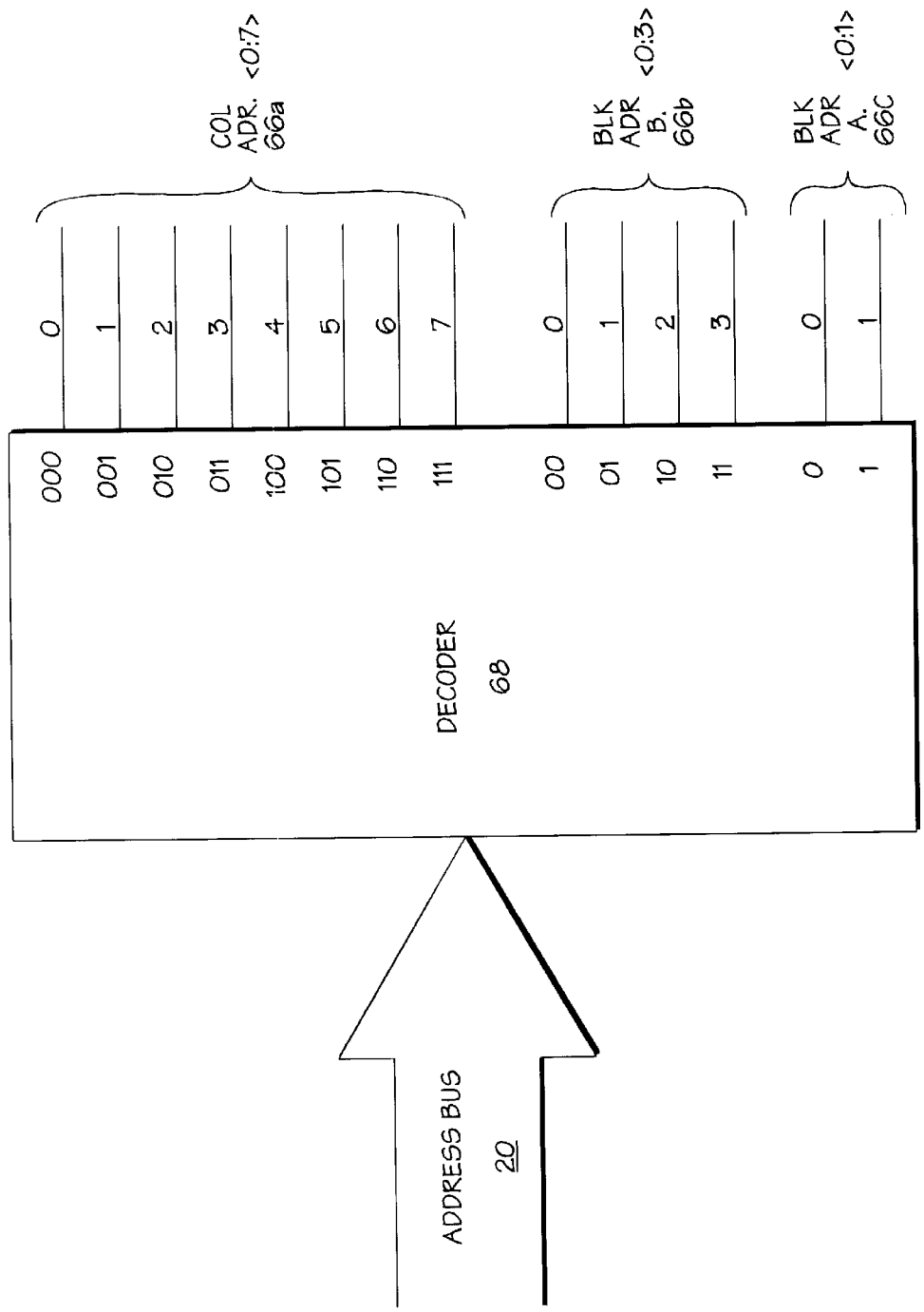

| Col. Address | | | Blk. Address | | | Key Signals | | | | | | | | | | | | |
|---|---|---|---|---|---|---|---|---|---|---|---|---|---|---|---|---|---|---|
| | | | | | | 1 | 2 | 3 | 4 | 5 | 6 | 7 | 8 | 9 | 10 | 11 | 12 |
| 0 | 0 | 0 | 1 | 0 | 1 | 1 | 0 | 0 | 0 | 0 | 0 | 0 | 0 | 0 | 0 | 0 | 0 |
| 1 | 1 | 0 | 0 | 1 | 0 | 0 | 1 | 0 | 0 | 0 | 0 | 0 | 0 | 0 | 0 | 0 | 0 |
| 0 | 0 | 1 | 1 | 1 | 0 | 0 | 0 | 1 | 0 | 0 | 0 | 0 | 0 | 0 | 0 | 0 | 0 |
| 1 | 1 | 0 | 0 | 0 | 1 | 0 | 0 | 0 | 1 | 0 | 0 | 0 | 0 | 0 | 0 | 0 | 0 |
| 0 | 0 | 1 | 0 | 0 | 1 | 0 | 0 | 0 | 0 | 1 | 0 | 0 | 0 | 0 | 0 | 0 | 0 |
| 1 | 1 | 0 | 1 | 0 | 0 | 0 | 0 | 0 | 0 | 0 | 1 | 0 | 0 | 0 | 0 | 0 | 0 |
| 1 | 1 | 1 | 0 | 1 | 1 | 0 | 0 | 0 | 0 | 0 | 0 | 1 | 0 | 0 | 0 | 0 | 0 |
| 0 | 0 | 0 | 1 | 0 | 0 | 0 | 0 | 0 | 0 | 0 | 0 | 0 | 1 | 0 | 0 | 0 | 0 |
| 1 | 1 | 1 | 0 | 1 | 1 | 0 | 0 | 0 | 0 | 0 | 0 | 0 | 0 | 1 | 0 | 0 | 0 |
| 0 | 0 | 0 | 1 | 0 | 0 | 0 | 0 | 0 | 0 | 0 | 0 | 0 | 0 | 0 | 1 | 0 | 0 |
| 0 | 1 | 1 | 1 | 1 | 1 | 0 | 0 | 0 | 0 | 0 | 0 | 0 | 0 | 0 | 0 | 1 | 0 |
| 1 | 0 | 0 | 0 | 0 | 0 | 0 | 0 | 0 | 0 | 0 | 0 | 0 | 0 | 0 | 0 | 0 | 1 |

Fig. 6

TEST MODE ENTRANCE THROUGH CLOCKED ADDRESSES

FIELD OF THE INVENTION

The present invention relates to integrated circuits, and especially memory devices, which include on-chip test mode capabilities and the activation thereof.

BACKGROUND

Complex integrated circuits, for example memory devices, programmable logic devices, etc., often include on-chip testing features which allow a designer (or customer) to verify operation of the integrated circuit prior to shipping (or use). To use these test mode features, the integrated circuit, or at least a portion of the functional circuitry which makes up the integrated circuit, must be placed in a test mode. In other words, the test mode must be activated.

In the past, test modes for integrated circuits have been activated in one of three ways. In some cases, test modes are entered by the application of "over-voltages" or "super-voltages" to one or more pins of the integrated circuit. In other cases, special test mode control pins are provided to allow activation of the test mode. In still further schemes, test modes may be entered through a unique addressing sequence applied to the integrated circuit.

Each of the above three schemes for entering a test mode presents potential hazards. With super-voltages, one always runs the risk of damaging sensitive circuitry contained on the integrated circuit. While the use of extra or special test mode activation pins avoids this problem, it requires that additional space be provided for the test mode control pins and may present compatibility problems. Address sequencing, although it avoids the problems of super-voltages and extra pins, presents a potential risk in as much as the user may inadvertently key the address sequence for entering the test mode without meaning to do so. Therefore, what is required is a method and apparatus for entering test mode of an integrated circuit which reduces the risk of unintentionally triggering the test mode and avoids the other problems presented by schemes of the past.

SUMMARY OF THE INVENTION

The present invention provides a robust system for entering a test mode in an integrated circuit, for example, a memory device. The present scheme greatly eliminates the probability of unintentionally entering the test mode, yet provides a system of access through a precise address and control pin sequence. By using an existing control pin present on the integrated circuit as a clock input for a series of latches, the present scheme allows for the use of a number of predetermined addresses in order to create a key that is correct only if all the addresses are at the correct values. The key, combined with the clock signal input, allows a test mode enable signal to pass through each latch in a series. By further requiring that the address sequence for the key be input during an otherwise "illegal" operation for the integrated circuit, the present scheme further ensures that unintentional entry to the test mode is avoided.

In one embodiment, the present invention provides a method which includes generating a test mode enable signal in an integrated circuit device using a clocked key sequence. The integrated circuit device may be a memory device, for example an SRAM, and the key sequence may be a unique series of addresses presented to the memory device. The unique series of addresses is clocked into the memory device using a clock signal applied to a control signal pin of the memory device. For example, the clock signal may be applied to an output enable signal pin of the memory device. Generating the test mode enable signal may include propagating a logic signal through a series of key stages using the clocked key sequence. In such a case, the clocked key sequence may be made up of a number of unique keys and each of the key stages may be responsive to a corresponding one of the unique keys. As indicated above, each of the unique keys may be a unique address set applied to the memory device.

In a further embodiment, the present invention provides a method which includes propagating a test mode enable signal through a series of clocked key stages in an integrated circuit device, for example a memory device. For one embodiment, each of the clocked key stages may be made up of a d-type flip-flop which is responsive to a clock signal and a corresponding unique key signal. In such cases, propagating the test mode enable signal may be accomplished by successively latching the test mode enable signal in each of the d-type flip-flops in response to the clock signal and a key sequence made up of the corresponding unique key signals. The clock signal may be applied to the integrated circuit device while another control signal, for example a write enable signal if the integrated circuit device is a memory device, is active. Again, the unique key signals may be a series of addresses.

In a further embodiment, the present invention provides an integrated circuit which includes test mode enable circuitry responsive to a series of clocked key signals. The test mode enable circuitry may include a series of key stages, each of which is configured to receive an input signal and to produce an output signal in response thereto when activated by a clock signal and corresponding unique key signal. For one embodiment, each of the key stages may be a d-type flip-flop. The integrated circuit device may be a memory device and/or may be included within a computer system. As above, each of the unique key signals may be produced by an address set and the clock signal may be derived from a control signal provided to the integrated circuit.

BRIEF DESCRIPTION OF THE DRAWINGS

The present invention is illustrated by way of example, but not limitation, in the figures of the accompanying drawings in which:

FIG. 5b illustrates an exemplary decoder for use in producing signals for the key signal generating circuitry of FIG. 5a;

FIG. 6 is a table which illustrates an exemplary key sequence produced by the key generating circuitry of FIG. 5a for a series of input addresses;

DETAILED DESCRIPTION

The present invention provides a robust system for entering a test mode of an integrated circuit, for example, a memory device. The present scheme greatly eliminates the probability of unintentionally entering the test mode, yet provides a system of access through a prescribed address and control pin sequence. By using an existing control pin present on the integrated circuit as a clock input for a series of latches, the present scheme allows for the use of a number of predetermined addresses in order to create a key that is correct only if all the addresses are at the correct values. The key, combined with the clock signal input, allows a test mode enable signal to pass through each latch in a series. By further requiring that the address sequence for the key be input during an otherwise "illegal" operation (or unpermitted time period) for the integrated circuit, the present scheme further ensures that unintentional entry to the test mode is avoided.

Figure 1:
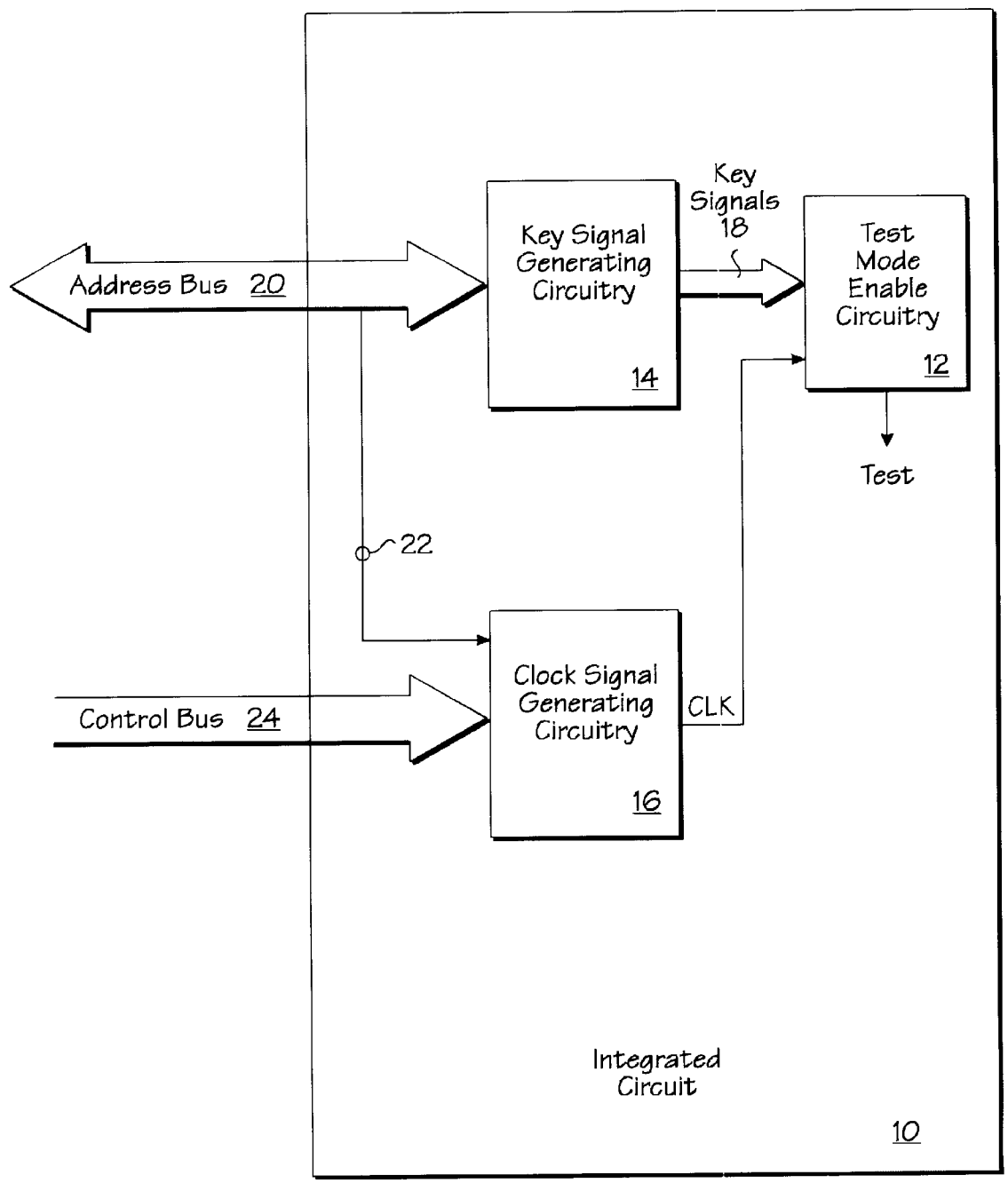
FIG. 1 illustrates an integrated circuit including test mode enable circuitry configured in accordance with one embodiment of the present invention.

Referring now to FIG. 1, an integrated circuit 10 which includes test mode enable circuitry 12 configured according to one embodiment of the present invention is shown. In addition to test mode enable circuitry 12, integrated circuit 10 includes key signal generating 14 and clock signal generating circuitry 16. As shown, key signal generating circuitry 14 provides key signals 18 to test mode enable circuitry 12 while clock signal generating circuitry 16 provides clock signal CLK thereto. In response to these signals, test mode enable circuitry 12 generates test mode enable signal TEST, which is an internal signal that may be used to place other circuitry within integrated circuit 10 in a desired test mode. For some embodiments, as will be described in more detail below, integrated circuit 10 may be a memory device, for example a static random access memory (SRAM). In other cases, integrated circuit 10 may comprise a programmable logic device, a complex programmable logic device, a field programmable gate array, or variations thereof. Each or any of such circuits may include on-chip memory which itself has an associated test mode.

Hereafter, it will generally be assumed that integrated circuit 10 is a memory device. However, this is merely for purpose of illustration, and should not be deemed to limit the present invention, which, in one embodiment, provides a method which includes generating a test mode enable signal in an integrated circuit device using a clocked key sequence. The key sequence may be a unique series of addresses which is clocked into the memory device (or other integrated circuit) using a clock signal applied to a control signal pin of the memory device. For example, the clock signal may be applied to an output enable signal pin of the memory device. Generating the test mode enable signal may include propagating a logic signal through a series of key stages using the clocked key sequence. In such a case, the clocked key sequence may be made up of a number of unique keys and each of the key stages may be responsive to a corresponding one of the unique keys.

Key signal generating circuitry 14 generates the unique key signals 18 in response to address signals provided by address bus 20. Clock signal generating circuitry 16 provides clock signal CLK in response to one or more address signals 22 and one or more control signals provided by control bus 24. The control signals may be provided to existing control signal pins, such as an output enable ($\overline{OE}$) pin, or an equivalent thereof.

Figure 2:
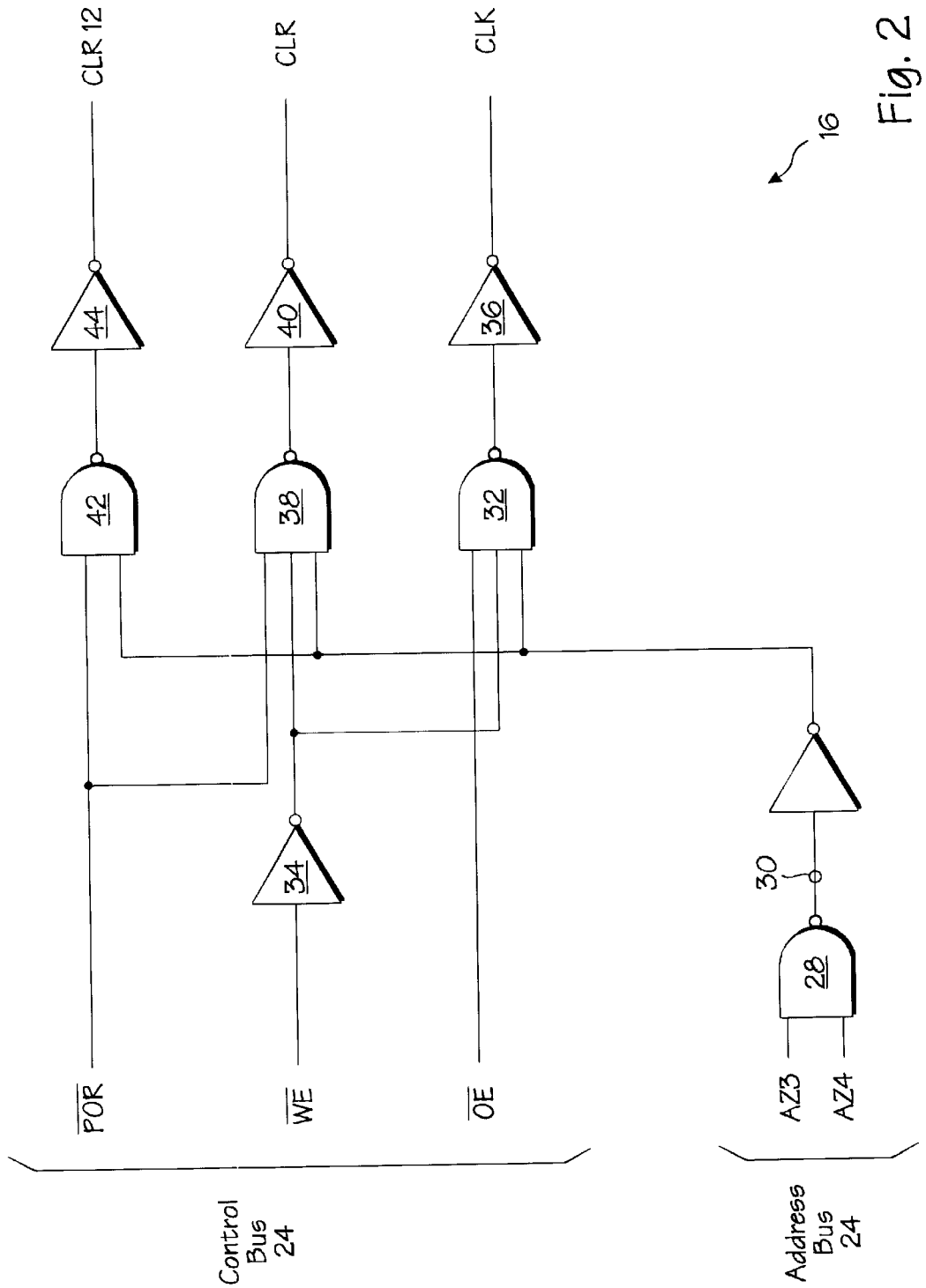
FIG. 2 illustrates clock signal generating circuitry for the integrated circuit of FIG. 1.

FIG. 2 illustrates clock signal generating circuitry 16 in more detail. As shown, for this embodiment clock signal generating circuitry 16 includes a number of logic gates which operate to combine various signals from control bus 24 and address bus 20 to produce clock signal CLK. In addition, clock generating circuitry 16 is capable of providing two clear signals CLR and CLR12, the purpose of which will be more fully described below. It should be recognized that clock generating circuitry 16 may be produced from a variety of different combination of logic gates and what is important is the overall functionality provided and not necessarily the precise circuitry.

To produce clock signal CLK, clock signal generating circuitry 16 first combines two address signals, AZ3 and AZ4, from address bus 20 in NAND gate 28. The resulting signal 30 is logically inverted and applied as one input to NAND gate 32. NAND gate 32 also receives as inputs output enable signal $\overline{OE}$ and the logical complement of write enable signal $\overline{WE}$, each from control bus 24. Both signal $\overline{OE}$ and signal $\overline{WE}$ are active low. To produce the logical complement of $\overline{WE}$, inverter 34 is employed prior to the input of NAND gate 32 as shown.

NAND gate 32 combines these three input signals so that when each is a logic high, the output of NAND gate 32 is a logic low and, due to the action of inverter 36, clock signal CLK is a logic high. As will be discussed further below, during the period of test mode entrance, signal $\overline{WE}$ is held low, while signals AZ3 and AZ4 are held high. Thus, clock signal CLK will follow output enable signal $\overline{OE}$ as signal $\overline{OE}$ toggles. In this fashion, signal $\overline{OE}$, which may be a signal applied to an external control pin of integrated circuit 10, allows for clocking test mode enable circuitry 12.

Signal CLR is also produced as a logical combination of various input signals to integrated circuit 10, including signal $\overline{WE}$, the logical combination of address signals AZ3 and AZ4, and a reset signal $\overline{POR}$. Reset signal $\overline{POR}$, the logical compliment of signal $\overline{WE}$, and the logical combination of address signals AZ3 and AZ4 are applied as inputs to NAND gate 38 and the resulting output signal is logically inverted by inverter 40 to produce signal CLR. In operation, reset signal $\overline{POR}$ is held high as are address signals AZ3 and AZ4. Thus, in response to write enable signal $\overline{WE}$ falling low, signal CLR will be pulled high. When write enable signal $\overline{WE}$ returns to a logic high, signal CLR will be a logic low.

Signal CLR 12 is produced from the logical combination of address signals AZ3 and AZ4 and reset signal $\overline{POR}$. These input signals are applied to NAND gate 42, the output of which is logically inverted by inverter 44. In operation, reset signal $\overline{POR}$ is held high and signal CLR 12 follows either of address signals AZ3 or AZ4. Basically, signal $\overline{WE}$ (low) is used because, in normal operation, address changes are "illegal" during such times (i.e., during write operations as indicated by signal $\overline{WE}$ being low). AZ3 and AZ4 are, in essence, clock enable inputs; if either is low, clock signal CLK is disabled and all key stages (see below) are cleared. Signal $\overline{POR}$ is a "power on reset" signal, generated by a chip enable signal. If the chip is disabled (i.e., signal $\overline{POR}$ is enabled), all of the key stages will be cleared.

Figure 3:
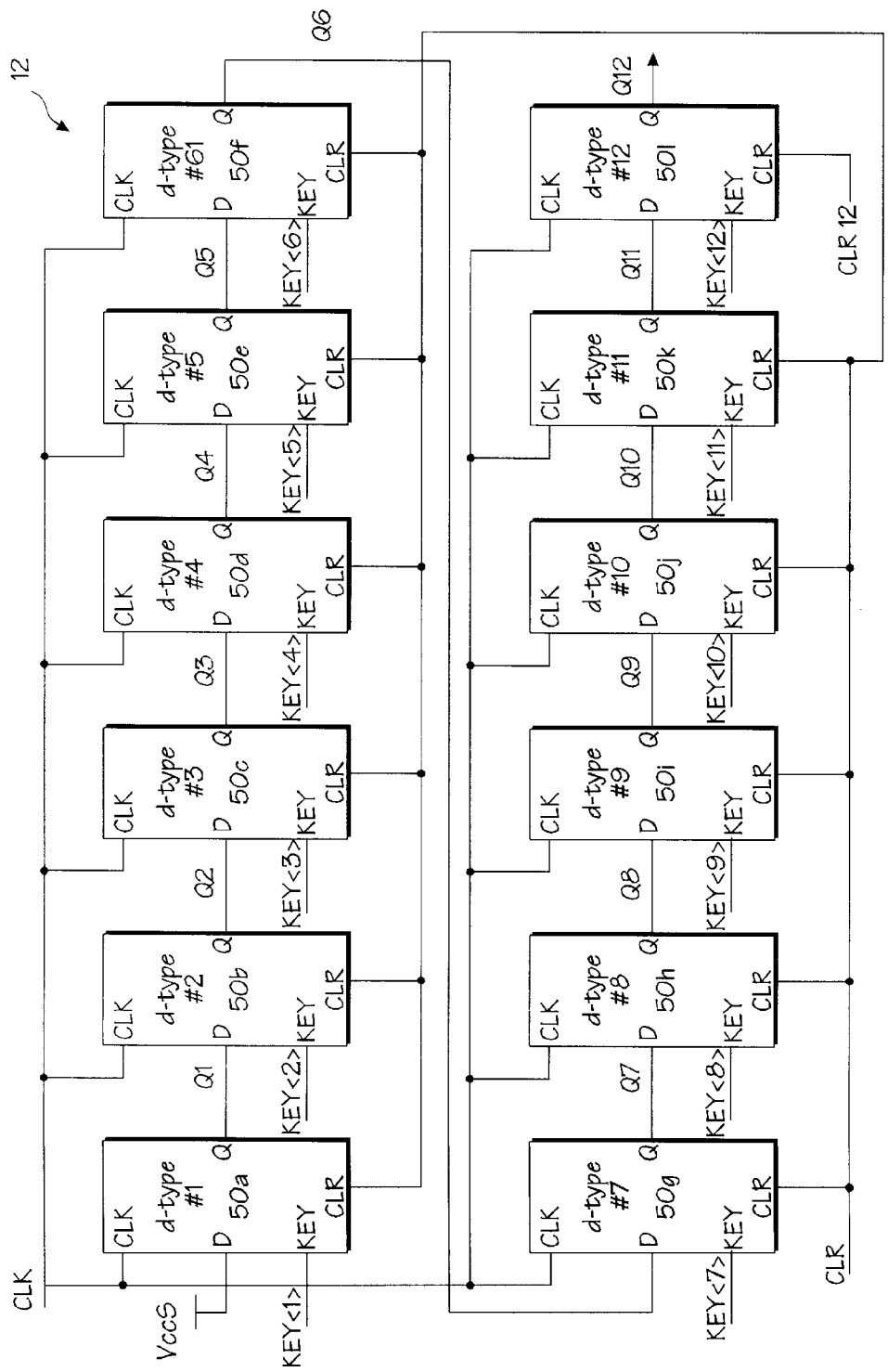
FIG. 3 illustrates test mode enable circuitry for the integrated circuit of FIG. 1 in more detail.

Referring now to FIG. 3, test mode enable circuitry 12 is shown in more detail. Test mode enable circuitry 12 is made up of the series of key stages, e.g., 1–12, each of which may be a d-type flip-flop 50a–50k and 52. D-type flip-flop 52 also referred to as d'type flip-flop and is similar to d-type flip-flops 50a–50k. The differences between these configurations will be described further below in connection with FIGS. 7 & 8.

Each of the key stages of test mode enable circuitry 12 receives an input signal (e.g., at the D input of the flip-flop) and produces an output signal (e.g., at the Q output of the flip-flop) in response thereto when signals at the clock and key inputs of the flip-flop are active. In other words, input signals are latched in the d-type flip-flops which comprise the key stages of test mode enable circuitry 12 when those inputs are clocked into the flip-flop. To clock the input signal into the flip-flop, it is necessary that both the clock signal and key signal be active. By chaining together the key stages so that the output of one key stage becomes the input to a next key stage as shown in FIG. 3, a logic signal may be propagated through the key stages in response to a series of clock and key signals. Each of the key signals, key<1>–key<12>, may be derived from a unique address applied to integrated circuit 10, and the logic signal may be propagated through the key stages in response to the series of unique key signals, e.g., on each falling edge of clock signal CLK.

Thus, the present invention provides a method which includes propagating a test mode enable signal through a series of clocked key stages in a integrated circuit device, for example a memory device. For one embodiment, each of the clocked key stages may be made up of a d-type flip-flop which is responsive to a clock signal and a corresponding unique key signal. In such cases, propagating the test mode enable signal may be accomplished by successively latching the test mode enable signal in each of the d-type flip-flop in response to the clock signal and a key sequence made up of the corresponding unique key signals. The clock signal may be applied to the integrated circuit device while another control signal, for example a write enable signal if the integrated circuit device is a memory device, is active. The unique key signals may be a series of addresses.

In a further embodiment, the present invention provides an integrated circuit which includes test mode enable circuitry responsive to series of clocked key signals. The test mode enable circuitry may include a series of key stages, each of which is configured to receive an input signal and to produce an output signal in response thereto when activated by a clock signal and corresponding unique key signal. For one embodiment, each of the key stages may be a d-type flip-flop. The integrated circuit device may be a memory device and/or may be included within a computer system. As above, each of the unique key signals may be activated by a set of address states and the clock signal may be derived from a control signal provided to the integrated circuit as shown in FIG. 2.

To illustrate the operation of test mode enable circuitry 12, consider the logic high signal (e.g., which may be produced by tying the D input for flip-flop 50a high) as it propagates through the various key stages. If key<1> is active, the logic high signal will be latched by flip-flop 50a on a first clock signal CLK. Thus, in response to the clock signal CLK, output signal Q1 will be logic high. This logic high signal Q1 may, in turn, be latched by flip-flop 50b on a next clock signal if, at the time the next clock signal is active, signal key<2> is active. Therefore, to propagate the logic signal through a next key stage, it is necessary that the next key signal in the sequence, in this case key<2>, be active when clock signal CLK is active. Thus, the timing of clock signal CLK should account for any setup time required for the key signals. Continuing in this fashion, the output Q of each prior key stage may be latched through a next key stage in response to successive clock signals CLK, provided that the unique key signals key<1>–key<12> are activated at the proper times. If the unique key signals, key<1>–key<12>, correspond to unique addresses from address bus 20, then sequencing through a specific set of address values in order to propagate the logic signal through the various key stages 50a–50k and 52, until a final output signal is produced at Q12 will produce the test mode enable signal TEST described above.

Figure 4:
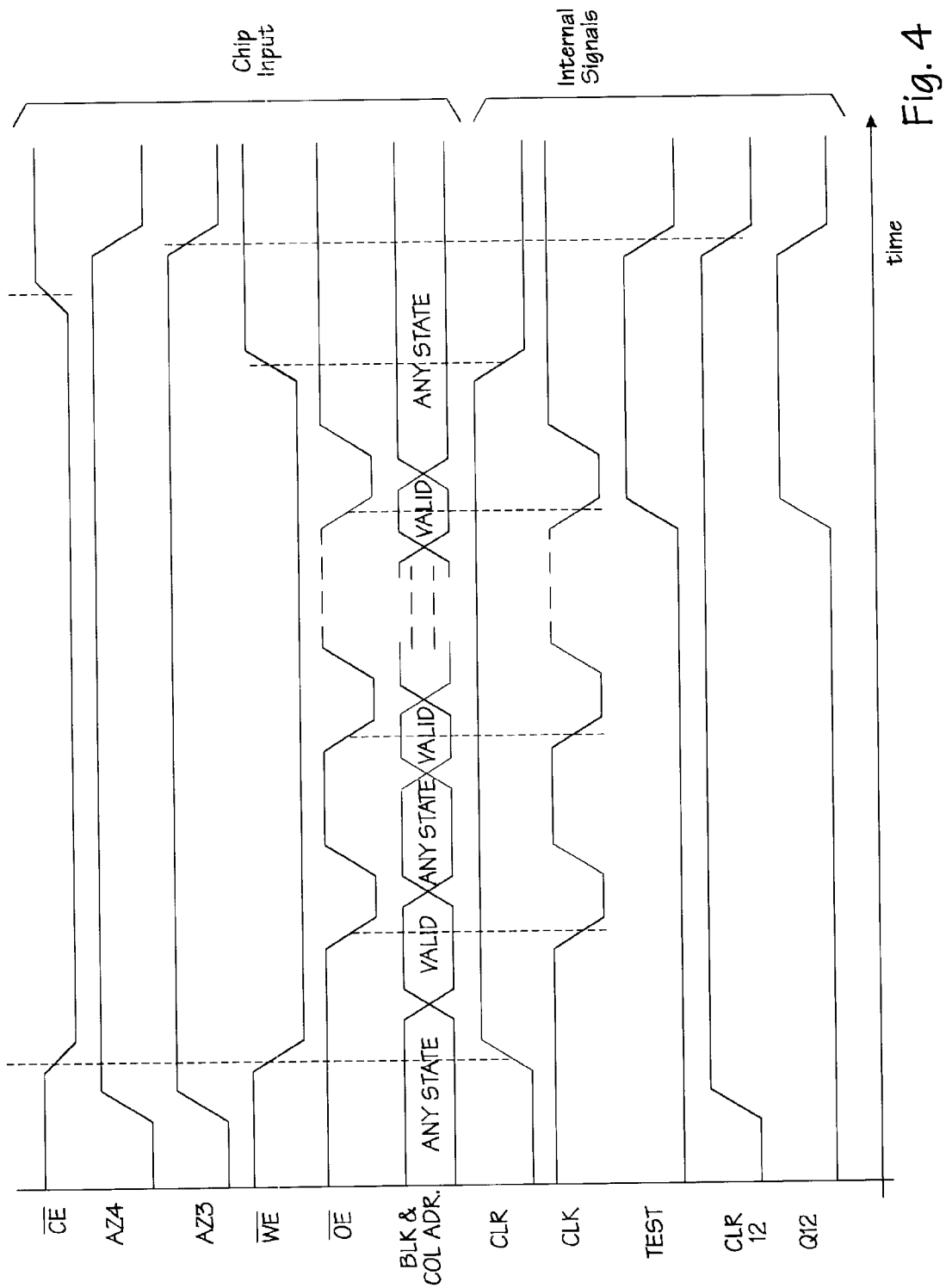
FIG. 4 is a timing diagram illustrating various wave forms of interest during the generation of a test mode enable signal for the integrated circuit of FIG. 1.

FIG. 4 illustrates some of the timing considerations necessary to insure proper sequencing of the various key stages of test mode enable circuitry 12. As shown, signals AZ3 and AZ4 are held high throughout the operation. It should be recalled that these address signals are used in generating clock signal CLK, signal CLR and signal CLR12. The clear signals CLR and CLR12 are applied to the key stages 50a–50k and 52 as shown in FIG. 3. In addition, as discussed above, output enable signal $\overline{OE}$ (or some other control input) may be used as a control signal to generate the internal signal CLK. Prior to a falling edge of signal CLK, the address signals (shown as block and column address signals in FIG. 4) are setup so that these signals are valid during a period of an active clock cycle. Thus, these addresses may be used to generate the unique key signals required by test mode enable circuitry 12.

In order to make the test mode enable circuitry as robust as possible, the present invention provides that test mode be entered though what may otherwise be a forbidden input sequence. For example, in the case of a memory device, it is generally assumed that address signals should not transition during a write operation. Thus, if the write operation is characterized by signal $\overline{WE}$ being low, one would not normally expect address transitions to take place during this time. Nevertheless, for the test mode enable scheme of the present invention, as is shown in FIG. 4, signal $\overline{WE}$ is held low during the entire test mode enable sequence. Thus, the address input sequence to enable the test mode involves changing addresses while $\overline{WE}$ is active. As this is an otherwise "illegal" operation, it provides a good starting point for ensuring that the test mode cannot be entered inadvertently.

As may be seen from FIG. 4, for this embodiment chip enable signal $\overline{CE}$ must kept active in order to enter test mode. When $\overline{CE}$ is inactive, the key signals shown in FIG. 3 cannot become valid. However, taking $\overline{CE}$ inactive once the test mode has been entered does not cause an exit from the test mode. Thus, $\overline{CE}$-related timing parameters may be evaluated inside test mode. On the other hand, signals AZ3 and AZ4 must both be active to enter and maintain the test mode; when either AZ3 or AZ4 is deactivated, the integrated circuit device (e.g., memory device) unconditionally exits the test mode.

In order to further decrease the probability of inadvertently entering the test mode, the use of the clock signal to sequence the key signals produced by addresses is introduced. By using the output enable signal ($\overline{OE}$), or another control signal, which is otherwise provided to the integrated circuit 10, to produce the clock signals CLK, no additional pins are required. Thus, the signal $\overline{OE}$ acts as a triggering edge for sequencing the address values (now presented as keys) and allowing the test mode enable signal to propagate though various key stages of test mode enable circuitry 12.

This makes the test mode entrance scheme rely on both the unique address sequences as well as their timing and also allows for any timing variation between address changes.

As shown in FIG. 4, once all the required address sequences have been clocked through (i.e., as key signals) test mode enable circuitry 12 generates output Q12 which may also act as test mode enable signal TEST. Further, as discussed above, signal CLR follows signals $\overline{WE}$ and AZ3/AZ4 and signal CLR12 follows address signals AZ3 and AZ4.

Figure 5A:
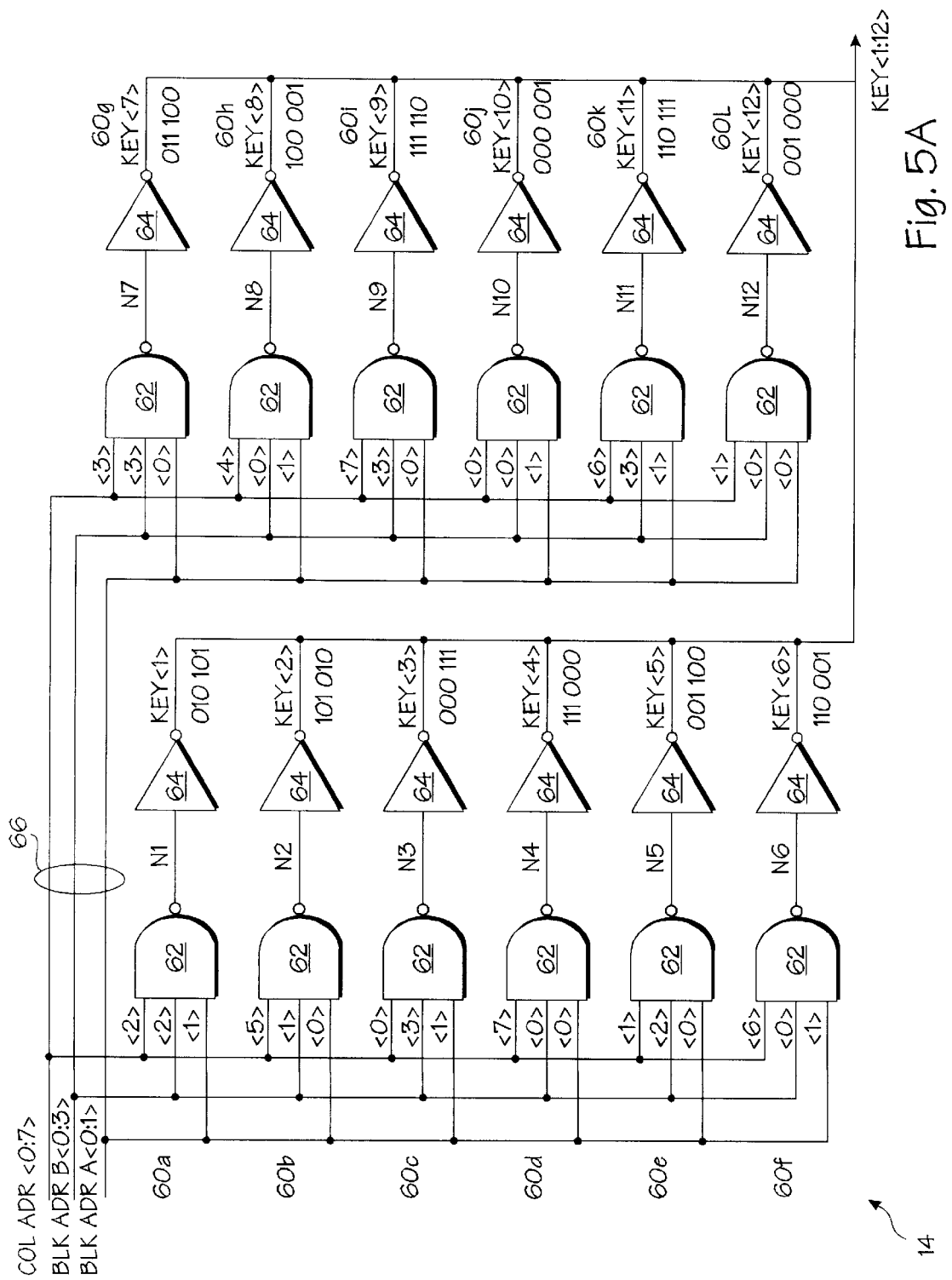
FIG. 5a illustrates key signal generating circuitry for the integrated circuit of FIG. 1.

FIG. 5a shows key signal generating circuitry 14 in more detail. Key signal generating circuitry 14 includes a number of key signal generating stages 60a–60l. Each key signal generating stage includes a NAND gates 62 and an inverter 64 (the combination of which is functionally a logical AND). Again, it is the functionality provided by the NAND gate 62 and inverters 64 which is important, and this functionality may be replicated by any of a number of logic gate sequences. Each NAND gate 62 receives as inputs three address signals and provides an output to inverter 64. The output of each inverter 64 is one of the unique key signals key<1>–key<12>0 used by test mode enable circuitry 12. The address signals 66 provided to the key signal generating stages 60a–60l may be produced as shown in FIG. 5b.

FIG. 5b illustrates a decoder 68 which receives address signals from address bus 20 and, in turn, produces column addresses 66a and block addresses 66b and 66c. Together, column addresses 66a, block addresses 66b and block addresses 66c make up the address signals 66 provided to each key signal generating stage 60. For the illustrated embodiment, decoder 68 provides eight column address signals 66a, four block address B signals 66b and two block address A signals 66c. Of course, other addressing schemes could be used. As shown in FIG. 5a, selected single address signals 66 are provided as inputs to a NAND gate 62 of each key signal generating stage 60. The goal is to produce unique key signals, key<1>–key<12>, from various unique combinations of address signals.

For the embodiment shown in FIGS. 5a and 5b, the table of FIG. 6 illustrates the address sequences required to generate key signals key<1>–key<12>. As shown, signal key<1> is produced from a column address 010 and a block address 101. Block address 101, in turn, is produced from block B address 10 and block A address 1. Referring back to FIG. 5a, this combination of input signals is provided to NAND gate 62 of key signal stage 60a and the resulting output signal N1 is logically inverted by inverter 64 to produce signal key<1>. FIG. 6 shows the remaining address combinations used to generate all 12 key signals.

Figure 7:
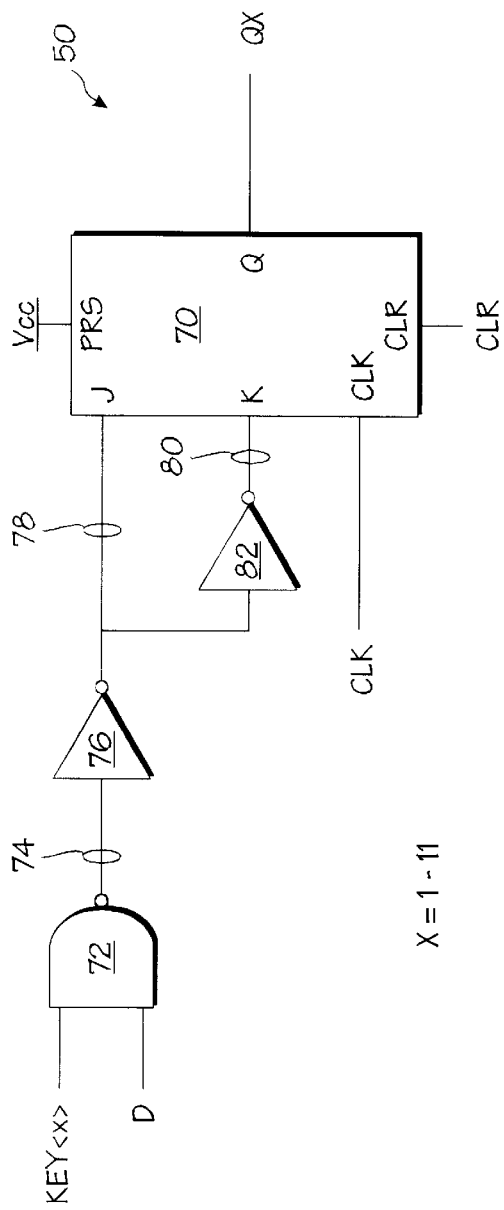
FIG. 7 illustrates an exemplary d-type flip-flop for the test mode enable circuitry of FIG. 3.

Referring now to FIG. 7, a d-type flip-flop 50 for use with test mode enable circuitry 12 is illustrated in more detail. For d-type flip-flops 50a–50k, each key, key<1>–key<11>, is latched through the flip-flop which is composed of a J–K flip-flop 70 and additional logic configured so that input K is the logical inverse of input J. More specifically, the corresponding key signal from key signal generating circuitry 14 (shown as key<X> in FIG. 7, X=1–11, and the input signal D (which may be the logic high signal in the case of d-type flip-flop 50a or the output signal of a preceeding key stage for d-type flip-flops 50b–50k) are applied to a NAND gate 72 to produce output signal 74. Signal 74 is applied to an inverter 76 to produce J input 78. As indicated above, K input 80 is the logical inverse of J input 78 due to the action of inverter 82. Each J–K flip-flop 70 also receives clock signal CLK at a clock input. The preset signal (PRS) of each J–K flip-flop 70 is tied high so that it has no effect on operation of the device. On each falling edge of the clock signal CLK, the value of the inputs J and K are latched to produce an output Q, where Q=J=$\overline{K}$. In response to a low going signal CLR, output signal Q will be pulled low.

Figure 8:
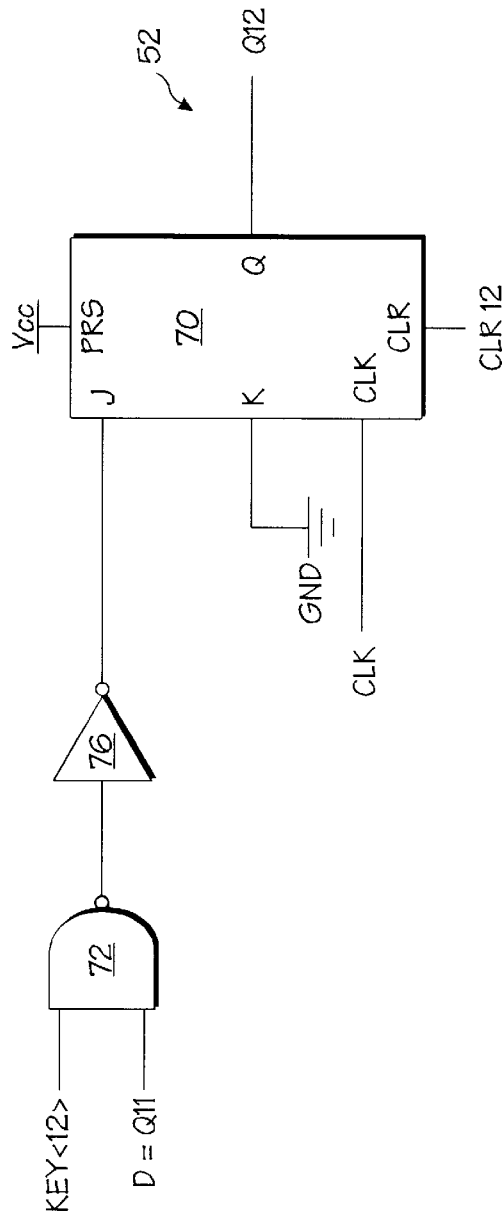
FIG. 8 illustrates an exemplary d'-type flip-flop for the last stage of the test mode enable circuitry of FIG. 3.

FIG. 8 illustrates d'-type flip-flop 52 for test mode enable circuitry 12 in more detail. As shown d'-type flip-flop 52 is very similar to d-type flip-flop 50 of FIG. 7, with the exception that for d'-type flip-flop 52, the K input to J–K flip-flop 70 is held low.

The J input is again a logical combination of the key signal (key<12>) and the D input, which in this case is provided by the preceeding key stage #11. Output signal key Q12 may be the test mode enable signal TEST as discussed above.

By chaining together the d-type flip-flops 50 and the d'-type flip-flops 52 (which together may be described as d-type flip-flops in general) the test mode enable signal will not be generated unless the proper address sequence is applied to integrated circuit 10 to generate the unique keys at the appropriate times to be clocked into the respective key stages of test mode enable circuitry 12. Note that the sequence can be cleared at any time during its input by raising signal $\overline{WE}$ to a logic high or by resetting the circuit (which will cause reset signal $\overline{POR}$ to pulse low). Alternatively, either of address signals AZ3 or AZ4 could be made logic low to reset the latches. Once the unique address sequence has been input, however, it cannot be cleared by toggling signal $\overline{WE}$ and is no longer affected by the clock signal ($\overline{OE}$). This allows the write enable and output enable signals to be used in their traditional manners once the integrated circuit 10 has been placed in test mode. In other words, the clock signal is transparent once test mode has been entered. Once the test mode has been attained, only by pulling one of address signals AZ3 or AZ4 low can it be disabled.

Figure 9:
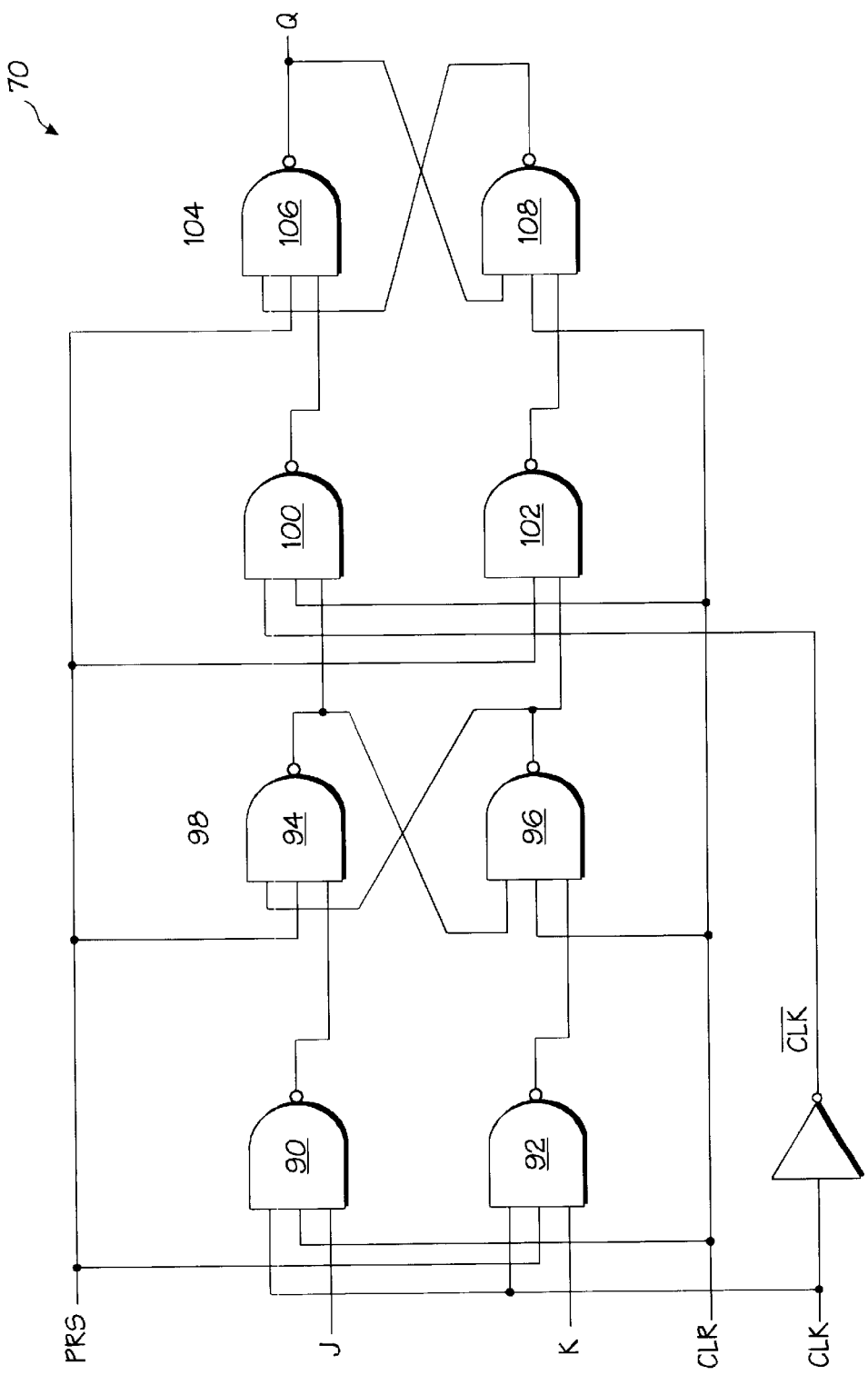
FIG. 9 illustrates a J–K flip-flop for use with the d-type and d'-type flip-flops of FIGS. 7 and 8.

FIG. 9 illustrates J–K flip-flop 70 in more detail. The J and K inputs are applied to NAND gates 90 and 92 respectively. NAND gates 90 and 92 also receive clock signal CLK as an input. Signal CLR is provided to NAND gate 90 while preset signal PRS is provided to NAND gate 92. The output of NAND gate 90 is applied to NAND gate 94 of a first stage latch 98 which also includes NAND gate 96. The output of NAND gate 92 is provided as an input to NAND gate 96 of first stage latch 98. First stage latch 98 is a traditional latch and provides output signals to NAND gates 100 and 102. NAND gates 100 and 102 operate in a fashion similar to NAND gates 90 and 92 and provide output signals to second stage latch 104 which is made up of NAND gates 106 and 108. The output of NAND gate 106 is the Q output of flip-flop 70.

Figure 10:
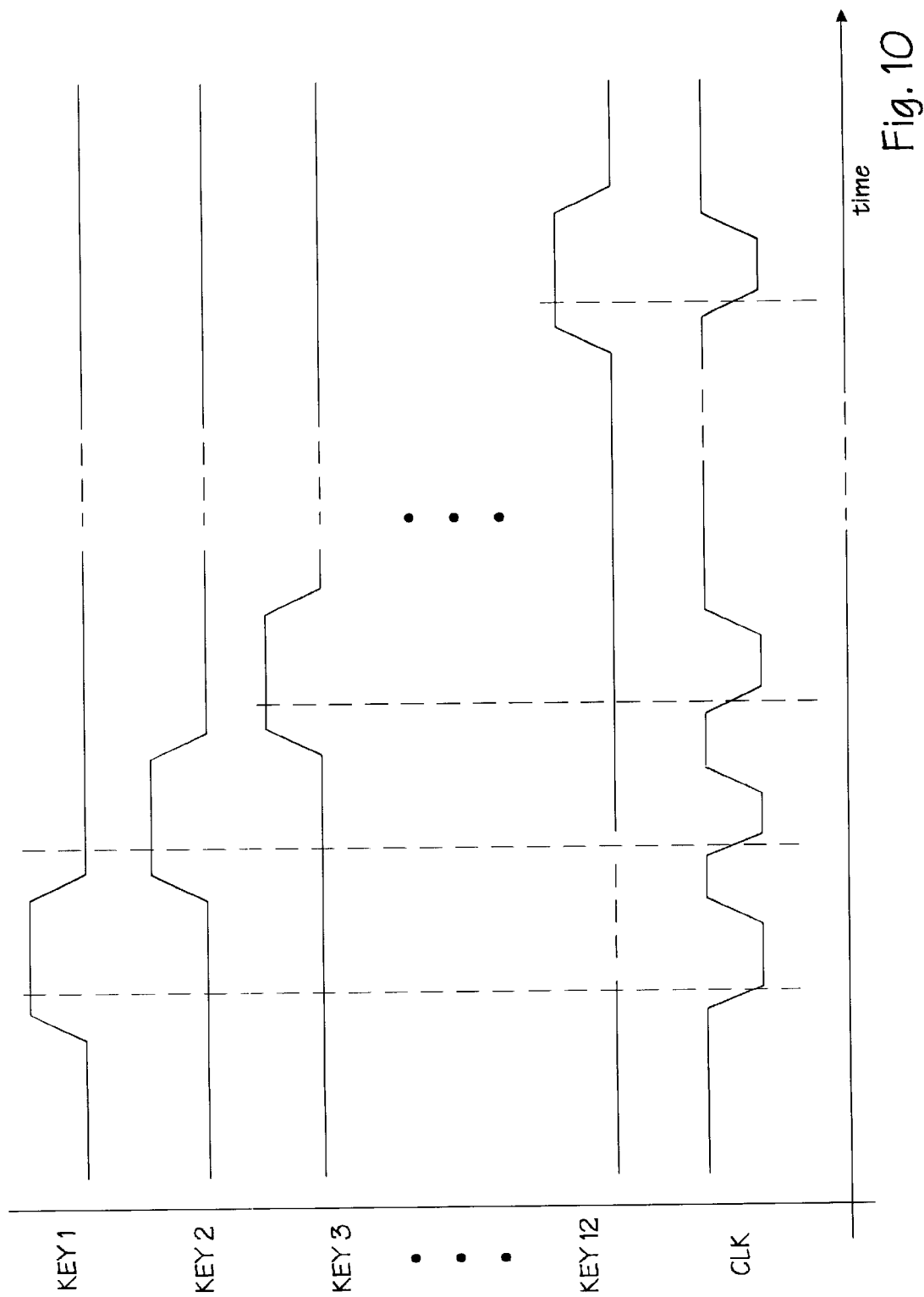
FIG. 10 is a timing diagram illustrating the timing relationships of key signals produced by the key signal generating circuitry of FIG. 5.

FIG. 10 illustrates the various key signals in the sequence. As shown, the keys are generated successively in time to activate successive key stages in the test mode enable circuitry 12. The keys are active during a falling edge of signal CLK.

Figure 11:
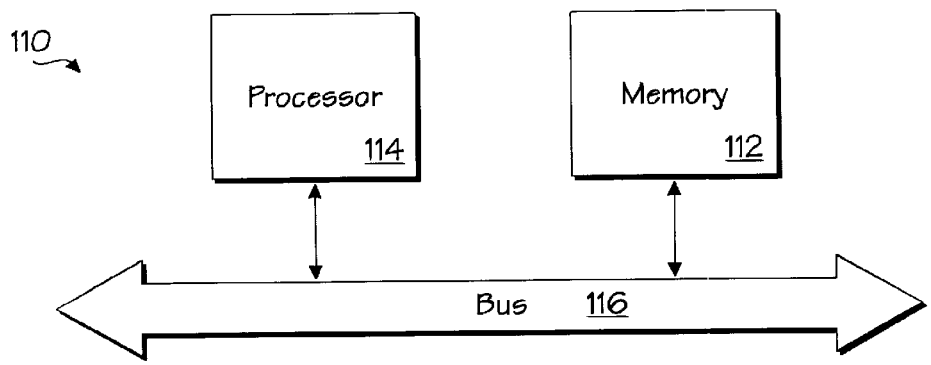
FIG. 11 shows an exemplary computer system including a memory which may be configured with the test mode enable circuitry of the present invention.

As discussed above, integrated circuit 10 may comprise a memory device which may be included within a computer system 110 as shown in FIG. 11. In such a case, computer system 110 will generally include the memory device 112 and a processor 114. These devices may be coupled together via a bus 116. In some cases, bus 116 may be a processor bus, in which case memory 112 may be cache memory. In other cases, bus 116 may be memory bus in which case memory 112 may be main memory for the computer system 110. In an alternative embodiment, memory 112 and processor 114 may be combined on a single substrate, or multiple substrates within a single integrated circuit package, and, in such cases, memory 112 may be a first level cache of processor 114.

Figure 12:
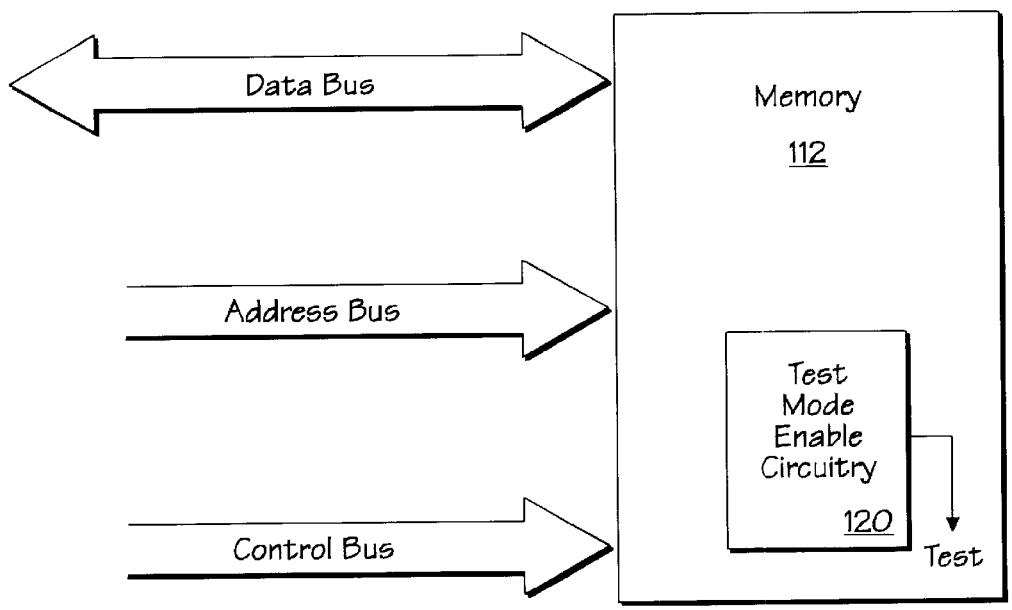
FIG. 12 illustrates the memory of FIG. 11 in more detail.

FIG. 12 shows memory 112 in more detail. Again, memory 112 includes test mode enable circuitry 120. For clarity, test mode enable circuitry 120 has been illustrated as though it includes key signal generating circuitry 14, test mode enable circuitry 12 and clock signal generating circuitry 16.

In order to demonstrate the remoteness of the possibility that the test mode may be entered inadvertently, consider the following. In the present scheme, twelve combinations of six addresses (recall that 12 key signals are provided by the key generating stages 60a–60l to generate these 12 signals at least 6 address inputs are required) must be clocked into test mode enable circuitry 12 on each of twelve consecutive falling edges of a control signal (e.g., $\overline{OE}$). At the same time, another control signal (e.g., $\overline{WE}$) must be active (i.e., low), while address AZ3 and AZ4 are logic high. This allows for $2^8$ combinations of addresses (e.g., due to the use of 8 total address signals to generate the keys) per key stage. In order for the test mode enable signal to propagate through all 12 key stages, the chance is:

$$\frac{1}{(2^8)^{12}} = 1.27 \times 10^{-29}$$

of entering the test mode accidently.

Therefore, if $\overline{WE}$ is held low and otherwise "illegal" random address changes are made, for a typical $\overline{OE}$ cycle of 15nsec, the probability of accidentally entering the test mode in 10 years is approximately:

$$(1.27 \times 10^{-29}) \frac{1}{(15 \times 10^{-9} \text{sec})} \times 60 \frac{\text{sec}}{\text{min}} \times$$

$$60 \frac{\text{min}}{\text{hr}} \times 24 \frac{\text{hr}}{\text{days}} \times 365 \frac{\text{days}}{\text{yr}} \times 10 \text{ yrs.} = 2.65 \times 10^{-13}$$

or one chance in 3.7 trillion.

If an average component manufacturer will ship approximately 20 million integrated circuits and assuming that 1% of such devices will be operated "illegally", thereby allowing address transitions while $\overline{WE}$ is low and $\overline{OE}$ is toggling, then the probability of any one device accidentally entering the test mode during its lifetime is approximately:

(2.65×10⁻¹³)(2×10⁷)(0.01)=3.30×10⁻⁸ or 1 in 19 million (assuming the component's useful life is 10 years). Of course, the addition of further d-type flip-flop key stages would inadvertent test mode entry even less likely.

Thus, a robust system for entering test mode has been described. Although discussed with reference to specific illustrated embodiments, the present invention may be practiced without some or all of these details and, accordingly, should only be measured in terms of the claims which follow.

What is claimed is:

1. A method, comprising generating a test mode enable signal in an integrated circuit device by propagating a logic signal through a series of key stages in response to a number of keys of a key sequence and a clock signal.

2. A method of claim 1 wherein said integrated circuit device is a memory device and said keys of said key sequence comprise a unique series of addresses.

3. The method of claim 2 wherein said clock signal is applied to a control signal pin of the memory device.

4. The method of claim 1 wherein said key stages each comprise a D-type flip-flop.

5. The method of claim 4 wherein each of said key stages is responsive to a different corresponding one of said unique keys.

6. The method of claim 5 wherein each of said keys is a unique address.

7. The method of claim 6 wherein said logic signal is latched by a first of said key stages only when a corresponding first one of said unique addresses selects said first key stage and said clock signal is applied to said first key stage.

8. The method of claim 7 wherein said clock signal is received at said integrated circuit device through a control signal input.

9. The method of claim 1 wherein said key sequence comprises a series of address signals applied to said integrated circuit during an otherwise unpermitted time period.

10. A method, comprising propagating a test mode enable signal through a series of clocked key stages in an integrated circuit device in response to a common clock signal and a series of unique key signals, each configured to activate a corresponding one of the clocked key stages.

11. The method of claim 10 wherein each of said series of clocked key stages comprises a d-type flip-flop responsive to said clock signal and one of said unique key signals and wherein said step of propagating comprises successively latching said test mode enable signal in each of said d-type flip-flops in response to said clock signal and a key sequence comprising said corresponding unique key signals.

12. The method of claim 11 wherein said integrated circuit device comprises a memory device and said clock signal is applied to said memory device while a control signal for said memory device is active.

13. The method of claim 12 wherein said unique key signals comprise a series of address sets.

14. An integrated circuit, comprising test mode enable circuitry responsive to a series of key signals each configured to activate a corresponding one of a number of key stages of the test mode enable circuitry and a common clock signal for the key stages.

15. The integrated circuit of claim 14 wherein each of said key stages is configured to receive an input signal and to produce an output signal in response thereto when activated by said clock signal and the corresponding key signal for that key stage.

16. The integrated circuit of claim 15 wherein each of said key stages comprises a d-type flip-flop.

17. A computer system comprising the integrated circuit of claim 14.

18. The computer system of claim 17 wherein said integrated circuit comprises a memory device.

19. The integrated circuit of claim 15 wherein said key signals comprise a set of address signals.

20. The integrated circuit of claim 19 wherein said clock signal is derived from at least one control signal provided to said integrated circuit.

21. The method of claim 1 wherein said key sequence comprises an otherwise illegal address sequence.

* * * * *